United States Patent [19]

Yamasaki et al.

[11] Patent Number: 5,004,649

[45] Date of Patent: Apr. 2, 1991

[54] RESIN LAMINATES AND A PROCESS FOR PRODUCTION THEREOF

[75] Inventors: Komei Yamasaki, Sodegaura; Keisuke Funaki, Ichihara, both of Japan

[73] Assignee: Idemitsu Kosan Co., Ltd., Tokyo, Japan

[21] Appl. No.: 327,815

[22] Filed: Mar. 23, 1989

[30] Foreign Application Priority Data

Apr. 13, 1988 [JP] Japan .................................. 63-89141
Nov. 26, 1988 [JP] Japan ................................ 63-297221

[51] Int. Cl.$^5$ .......................... B32B 15/08; B05D 1/00
[52] U.S. Cl. .................................... 428/461; 427/209; 427/404
[58] Field of Search ............... 428/516, 903, 457, 461; 526/160; 427/209, 404

[56] References Cited

U.S. PATENT DOCUMENTS 4,405,666 9/1983 Squier .............................. 428/516 X
4,657,802 4/1987 Morman .......................... 428/903 X
4,680,353 7/1987 Ishihara et al. ...................... 526/160

FOREIGN PATENT DOCUMENTS 0060526 9/1982 European Pat. Off. .
210615 4/1987 European Pat. Off. ............ 526/160

Primary Examiner—Thomas J. Herbert
Attorney, Agent, or Firm—Frishauf, Holtz, Goodman & Woodward

[57] ABSTRACT

A resin laminate comprising a layer of styrene-based polymer having mainly syndiotactic configuration and a thermoplastic resin layer, a metallized laminate comprising a layer of the styrene-based polymer described above and a metal layer, and process for producing these laminates are disclosed. In the laminate, the styrene-based polymer layer and the thermoplastic resin layer may be biaxially stretched.

The laminates are expected to be utilized for electrostatic capacitors, hot stamping foils, flexible printed circuit board substrates, food wrapping films, and other functional films including magnetic tapes, and ornament films.

8 Claims, No Drawings

RESIN LAMINATES AND A PROCESS FOR PRODUCTION THEREOF

BACKGROUND OF THE INVENTION

1. Field of the Invention

The present invention relates to resin laminates, resin laminates having metal layers and a process for production thereof.

2. Description of the Related Arts

Resin laminates have conventionally been used as films or sheets for wrapping or ornaments, or materials for electric or electronic parts, and resin laminates having metal layers have been used for magnetic tapes, electrostatic capacitors, hot stamping foils, flexible printed circuit board, food wrapping materials or ornaments.

Among these resin laminates, those having styrene-based polymer layer as one of the constituting layers are known. Since the styrene-based polymers used there, however, have atactic configuration, they are unsatisfactory in heat resistance, solvent resistance, hot-water resistance or stiffness.

In the laminates having metal layers, most of the functional films are made of polyethylene telephthalate, polyphenylene sulfide, polyimide, polyamide or polyolefin, but few of them are satisfactorily well-balanced in heat resistance, dimentional stability, chemical resistance, electrical properties, mechanical properties, gas barrier properties and cost.

For example, the polyethylene telephthalate used for electrostatic capacitor has large dielectric loss tangent (tan δ) around the glass transition temperature, and poor in frequency properties. In contrast, polystyrenes having atactic configuration excellent in frequency properties are poor in heat resistance.

Films for wrapping food, on the other hand, may be used at high temperatures and at high humidities in some cases. Accordingly, films made of polyethylene telephthalate or polyamide has the possibility of being hydrolyzed, while polypropylene and the like which do not hydrolyze easily are poor in heat resistance. With regard to the film as simple substance, polyphenylene sulfide (PPS) well-balanced in physical properties is small in adhesivity to metals, poor transparency and expensive.

The present inventors have earnestly repeated the researches so as to overcome the said disadvantages of the conventional resin laminates and laminates having metal layers, and to develop a resin laminate and a laminate having metal layer which are excellent in various physical properties.

The present inventors' group have found that a resin laminate having excellent physical properties can be produced by employing as the starting material the styrene-based polymer having high syndiotacticity developed before (Japanese Patent Application Laid-open No. 104818/1987), on which other thermoplastic resins or metals are laminated. Furthermore, they have found that said resin laminate can be produced efficiently by a specified process for producing. The present invention has been completed based on the above knowledge.

SUMMARY OF THE INVENTION

An object of the present invention is to provide a resin laminate excellent in gas barrier properties and fracture strength as well as having heat resistance, acid resistance, alkali resistance, hot-water resistance, stiffness and electrical properties.

Another object of the present invention is to provide a laminate having a metal layer, excellent in heat resistance, dimensional stability, chemical resistance, electrical properties, mechanical properties, gas barrier properties and the like.

Further object of the present invention is to provide a process for producing efficiently the resin laminate and the laminate having a metal layer, excellent in physical properties.

More specifically, the present invention provides laminate (I) comprising a layer of styrene-based polymer having mainly syndiotactic configuration (SPS) and a thermoplastic resin layer, laminate (II) comprising a biaxially costretched SPS layer and thermoplastic resin layer, laminate (III) comprising a biaxially stretched SPS layer and a thermoplastic resin layer, laminate (IV) comprising a SPS layer and a metal layer, and laminate (V) comprising a biaxially stretched SPS layer and a metal layer, and processes for producing them.

DESCRIPTION OF PREFERRED EMBODIMENTS

The styrene-based polymer layer in the laminate of the present invention comprises a styrene-based polymer having mainly syndiotactic configuration. The styrene-based polymer having mainly syndiotactic configuration means that the polymer has a stereostructure with a configuration that is mainly syndiotactic, i.e., the stereostructure in which phenyl groups or substituted phenyl groups as side chains are located alternately at opposite directions relative to the main chain consisting of carbon-carbon bonds. The tacticity is quantitatively determined by the nuclear magnetic resonance method using carbon isotope ($^{13}$C-NMR method). The tacticity as determined by the $^{13}$C-NMR method can be indicated in terms of proportions of structural units continuously connected to each other, i.e., a diad in which two structural units are connected to each other, a triad in which three structural units are connected to each other, or pentad in which five structural units are connected to each other. Styrene-based polymers having mainly the syndiotactic configuration of the present invention include polystyrene, poly(alkylstyrene), poly(halogenated styrene), poly(alkoxystyrene), poly(vinyl benzoate) and the mixtures thereof, and copolymers containing the above polymers as the main component, having such a syndiotacticity that the proportion of diads is at least 75% and preferably at least 85%, or the proportion of pentads (racemic pendads) is at least 30% and preferably at least 50%.

In case of styrene-based polymers with low syndiotacticity, the resulting laminates cannot be expected to have so excellent physical properties as desired.

The above poly(alkylstyrene) includes poly(methylstyrene), poly(ethylstyrene), poly(isopropylstyrene), poly(tert-butylstyrene) and the like. Specific examples of the poly(halogenated styrene) are poly(chlorostyrene), poly(bromostyrene), poly(fluorostyrene) and the like. The poly(alkoxystyrene) includes poly(methoxystyrene), poly(ethoxystyrene) and the like. The most preferred styrene-based polymers are polystyrene poly(p-methylstyrene), poly(m-methylstyrene), poly(p-tert-butylstyrene), poly(p-chlorostyrene), poly(m-chlorostyrene), poly(p-fluorostyrene), and a copolymer of styrene and p-methylstyrene.

The styrene-based polymer used in the present invention is not critical for its molecular weight, but preferably has a weight average molecular weight of at least 10,000, most preferably at least 50,000. Particularly, in case of obtaining a laminate having a metal layer, the weight average molecular weight of the styrene-based polymer used is preferably at least 50,000, most preferably at least 100,000.

The molecular weight distribution is not critical, and the styrene-based polymers in various range of molecular weight can be applied. If the weight average molecular weight is less than 10,000, a resin laminate having a sufficient mechanical strength or heat resistance cannot be obtained in some cases.

Such a styrene-based polymer having mainly syndiotactic configuration can be obtained, for example, by polymerizing a styrene-based monomer (corresponding to the desired styrene-based resin) with a catalyst comprising a titanium compound and a condensate of water and trialkylaluminum in the presence or absence of an inert hydrocarbon solvent (Japanese Patent Application Laid-Open No. 187708/1987).

To the styrene-based polymer for the present invention, thermoplastic resins, inorganic fillers, antioxidants, nuclear agents, plasticizers, solubilizing agents, coloring matters, antistatic agents and the like can be added.

As the antioxidant, various kinds can be used in the present invention, but particularly preferable are phosphorus antioxidants including monophosphites and diphosphites, and phenolic antioxidants. Typical examples of the monophosphites are tris(2,4-di-tert butylphenyl)phosphite, tris(mono or di-nonylphenyl)phosphite and the like.

Preferable diphosphites are the phosphorus compounds represented by the formula:

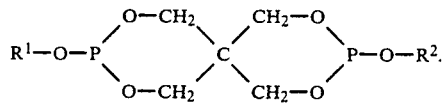

(wherein $R^1$ and $R^2$ are each an alkyl group having 1 to 20 carbon atoms, a cycloalkyl group having 3 to 20 carbon atoms, or an aryl group having 6 to 20 carbon atoms).

Typical examples of the formula are distearylpentaerythritol diphosphite, dioctylpentaerythritol diphosphite, diphenylpentaerythritol diphosphite, bis(2,4-di-tert-butylphenyl)pentaerythritol diphosphite, bis(2,6-di-tert-butyl-4-methylphenyl)pentaerythritol diphosphite, dicycloexylpentaerythritol diphosphite and the like.

As a phenolic antioxidant, various known compounds can be used. Representative examples of them are 2,6-di-tert-butyl-4 methylphenol, 2,6 diphenyl-4-methoxyphenol, 2,2'-methylenebis(6-tert-butyl-4-methylphenol), 2,2'-methylenebis(4-methyl-6-(alpha-methylcyclohexyl)phenol), 1,1-bis(5-tert-butyl-4-hydroxy-2-methylphenyl)butane, 2,2'-methylenebis(4-methyl-6-cyclohexylphenol), 2,2'-methylenebis(4-methyl-6-nonylphenol), 1,1,3-tris(5-tert-butyl-4-hydroxy-2-methylphenyl)butan, 2,2-bis(5-tert-butyl-4-hydroxy-2-methylphenyl)-4-n-dodecylmelcapoobutane, ethyleneglycol-bis(3,3-bis(3-tert-butyl-4-hydroxyphenol)butylate), 1-1-bis(3,5-dimethyl-2-hydroxyphenol)-3-(n-dodecylthio)butane, 4,4'-thiobis(6-tert-butyl-3-methylphenol), 1,3,5-tris(3,5-di-tert-butyl-4-hydroxybenzyl)-2,4,6-trimethylbenzene, 2,2-bis(3,5-di-tert-butyl-4-hydroxybenzyl)malonic acid dioctadecyl ester; n-octadecyl-3-(4-hydroxy-3,5-di-tert butylphenyl)propionate, tetrakis(methylene(3,5-di-tert butyl-4-hydroxyhydrocinnamate))methane and the like.

The above antioxidant is compounded in the amount of 0.0001 to 2 parts by weight preferably 0.001 to 1 parts by weight per 100 parts by weight of the styrene-based resin having mainly syndiotactic configuration mentioned before.

If the amount of the antioxidant compounded is less than 0.0001 parts by weight, no sufficient effect can be obtained since the molecular weight drops steeply. If it is more than 2 parts by weight, on the other hand, mechanical strength is influenced adversely.

The thermoplastic resins include styrene-based polymers such as a polystyrene having atactic configuration, a polystyrene having isotactic configuration, AS resin, ABS resin and the like. In principle, they are similar to the thermoplastic resins used for the thermoplastic resin layer mentioned later.

Inorganic fillers to be used here may be in the form of fiber, particles or powders. Inorganic fibers include glass fiber, carbon fiber, alumina fiber and the like. Inorganic fillers in particle or powder form, include talc, carbon black, graphite, titanium dioxide, silica, mica, calcium carbonate, calcium sulfate, barium carbonate, magnesium carbonate, magnesium sulfate, barium sulfate, oxysulfate, tin oxide, alumina, kaolin, silicon carbide, metal powder, calcium phosphate, clay and the like.

These inorganic fillers primarily effect the film surface according to the form, especially in case of thin film, diameter of the particle and the like, so usually they are preferably selected so that the particle diameter may be smaller than 1/5, preferably smaller than 1/10 of the thickness of the film, and desired surface-properties and physical properties can be obtained according to the object. Plural kinds of them can be used as mixture.

The laminates of the present invention possess a layer of styrene-based polymer (SPS) described above, which may be subjected to or may not be subjected to stretching treatment. The SPS film or sheet subjected to biaxial stretching treatment in advance is produced as follows. A styrene-based polymer having mainly syndiotactic configuration is melted at a temperature not lower than the melting point, then quenched to produce an amorphous sheet. Subsequently, said sheet is stretched at a temperature not lower than its glass transition temperature and not higher than its melting point. The quenching rate is not critical, but usually from 200° to 3° C./sec., preferably 200° to 5° C./sec.

The stretched film described above can be improved further in dimensional stability or heat resistance by heat treatment (annealing) at temperatures not lower than its transition temperature and not higher than its melting point. Therein the period and the temperature for the heat treatment can be selected appropriately with regard to draw ratio, thickness, composition, purpose or physical properties of the stretched substance. Generally, the possible temperature for the heat treatment is not lower than the glass transition temperature and not higher than the melting point, and the period for the heat treatment is 1 second to 100 hours. But the temperature for the heat treatment is preferably set in the range of a temperature of 20° C. higher than the glass transition temperature to a temperature of 5° C. lower than the melting point, and the period for the heat treatment is preferably 5 seconds to 30 minutes. If the temperature for the heat treatment is lower than the glass transition temperature, no effect from heat treatment can be expected, while if it is in excess of the melting point, a part of or whole of the film is melted in heat treatment.

For example, in case the stretched syndiotactic polystyrene homopolymer film is used for electrostatic capacitor, a film of 1 to 15μm in thickness is preferably heat-treated at 150° to 270° C. for 1 to 100 seconds, and in case it is used for wrapping food, it is preferably heat-treated at 110° C. to 270° C. for 3 to 300 seconds.

The draw ratio in the stretching is preferably not less than 2 times in square measure (that is, the area ratio of the film after stretching to the original sheet), and more preferably not less than 3 times, with the mechanical properties of the film taken into consideration.

The amorphous sheet obtained by quenching may be in a circular form or in plane sheet, and simultaneously or successively stretched by use of gas pressure (that is, inflation or blow molding), or by a tenter.

When a circular die is used, stretching can be carried out immediately after melting at the temperatures not lower than the glass transition point and not higher than the melting point.

The thermoplastic resin which constitutes the thermoplastic resin layer of the present invention is not critical, but can be selected properly according to the uses of the resin laminates to be produced. Examples of said thermoplastic resins are styrene-based polymers including polystyrene having atactic configuration, polystyrene having isotactic configuration, AS resin, and ABS resin, polyester resins including polyethylene telephthalate (PET), polybutylene telephthalate (PBT) and polyethylene naphthalate (PEN) and further, polycarbonate resins, polyphenylene sulfide resins (PPS), polyamide resins and the like. Further examples of the said resins are polyether resins such as polyphenylene oxide, polysulfone and polyether sulfone, acrylic resins such as polyacrylic acid, polyacrylate ester and polymethylmethacrylate, polyolefin resins such as polyethylene, polypropyrene, polybutene, poly-4-methylpenten-1, ethylene-propylene copolymer, ethylene-acrylate copolymer, ethylene-vinylalcohol copolymer and ethylene-vinylacetate copolymer, halogen containing vinyl compound polymers such as polyvinyl chloride, polyvinylidene chloride, polyvinylidene fluoride, polyoxymethylene, polyvinyl alcohol and the derivatives thereof.

When the resulting resin laminates are required for high mechanical properties, thermoplastic resins to be selected are polyester resins, polyamide resins, polycarbonate resins, polyolefin resins, or halogen containing vinyl compound polymers. When gas barrier properties are regarded as important, polyester resins including PET, polyamide resins, PPS, polyvinyl alcohol resins, polyvinylidene chloride and the derivatives thereof or ethylene vinyl acetate should be selected. Resin laminates excellent in heat sealing properties can be obtained by selecting thermoplastic resins having low melting points.

Kinds of the metals used for the metal layer of the present invention are not critical, but the examples of said metals are alloys or oxides of aluminum, chromium, nickel, zinc, cobalt, iron, tin, indium, molybdenum, tungsten and the like.

The laminates of the present invention comprise the styrene-based polymer having mainly syndiotactic configuration (SPS) layer described before and a thermoplastic resin layer, or comprises the SPS layer and a metal layer. The structures of said laminates include not only two layers of SPS and thermoplastic resin or SPS and metal, but also various forms containing these two layers. Therein the number of said layers and the order of laminating are not critical, but can be selected properly according to the situations.

As the laminates containing a SPS layer and a thermoplastic resin layer, the examples of possible laminate structures are SPS layer/thermoplastic resin layer/SPS layer, thermoplastic resin layer/SPS layer/thermoplastic resin layer, SPS layer/thermoplastic resin layer/thermoplastic resin layer, and others. In the laminates containing a SPS layer and a metal layer, an intermediate layer for improving adhesivity or for releasing can be provided between the SPS layer and the metal layer according to the purpose, or a top coat layer, an adhesive agent layer, a tacky layer and the like can be provided on the surface of the metal layer. And as the laminates containing SPS layer, thermoplastic layer and metal layer; the examples of possible laminate structures are metal layer/SPS layer/thermoplastic layer, SPS layer/thermoplastic layer/metal layer, SPS layer/metal layer/thermoplastic layer, and others. In these laminate structures, when a laminate contains plural SPS layers, thermoplastic resin layers or/and metal layers, each of them may be identical or different.

In the present invention, the thickness of the whole layers of the resin laminate is not critical. In laminates containing SPS layers and thermoplastic resin layers, the thickness is usually 5 to 500 μm, and the ratio of thickness of each layer can be determined properly according to the purpose, but usually can be selected in the range where thermoplastic resin layer/SPS layer is 1 to 30.

One of the preferred embodiments of the resin laminates of the present invention is a laminate consisting of three layers, that is, SPS layer/PET layer/SPS layer, having the thickness of 20 to 200 μm, with the ratio in thickness of each layer as SPS layer/PET layer/SPS layer = 1/1 to 30/1. Said laminate is superior not only in heat resistance, acid resistance, alkali resistance and solvent resistance but also in mechanical strength and gas barrier properties.

Another embodiment of the resin laminate is consisting of three layers, that is, PPS layer/SPS layer/PPS layer, having the thickness of 20 to 200μm, with the ratio in thickness of each layer is in the range as PPS layer/SPS layer/PPS layer = 1/1 to 30/1, and is remarkably excellent in heat resistance among all.

In the laminates containing a SPS layer and a metal layer, the kind of metals and the order of the layers can be determined properly according to the purpose. Usually preferred one is a laminate obtained by depositing Al, Au, Cu, Cr, Ni, Fe, Co and the like in thickness of less than 1 μm upon a film of 0.5 to 200μm in thickness by use of deposition process, or a laminate obtained by laminating aluminum foil, copper foil and the like upon the film.

In producing the resin laminate (I) comprising SPS layer and thermoplastic resin layer of the present invention, various methods are possible according to the forms or uses of the laminate. Usual methods may be employed in combination properly according to the situations. Representative methods for producing laminate (I) are following (1) and (2).

In Method (1), SPS and thermoplastic resins are co-extruded in multilayers from the molding apparatus having multilayer forming die, to form multilayer cast molding film, or further the resulting film is subjected to multilayer inflation molding to form multilayer inflation film. In this process, to increase the adhesivity between the layers, an adhesive layer having an affinity for each SPS layer and thermoplastic resin layer can be provided, or adhesive material can be compounded in advance with either of or both of SPS and thermoplastic resin. In the production of the multilayer cast molding film, it is preferred to set T die temperature to around 280° to 350° C., in case of stretching after extruding the temperature of cooling roll to not higher than 90° C. Particularly, if the temperature of the cooling roll is set to not higher than 70° C., amorphous film or sheet can be obtained, and if draft ratio (taking up rate/extruding rate) is set small, less orientated sheet or film can be obtained. If necessary, stretching treatment can be effected.

Otherwise, the resin laminates of the present invention can be formed by laminating a SPS film and a thermoplastic resin film (stretched or unstretched) having been molded separately in advance (Method (2)).

In this laminating process, each film surface may be treated with corona, plasma or ozone previously, or interlayer adhesives (for example, adhesives for dry laminates, such as hardening type urethane-based adhesives) can be applied. The temperature of the press roll in laminating is preferably 50° to 100° C., and the proper rate of processing is 50 to 150 m/minutes.

The resin laminates (II) comprising a biaxially stretched SPS layer and a biaxally stretched thermoplastic resin layer of the present invention can be obtained by stretching the sheet resulted by Method (1) or (2) described above. In this process, when stretching is effected to produce stretched multilayer film, the stretching method can be selected properly from tublar biaxial stretching, sequential biaxial stretching, and simultaneous biaxial stretching. The conditions for said stretching treatment differ with the situations and cannot be defined simply, but usually may be set as the temperature in a range of between glass transition temperature (Tg) and melting temperature (Tm), preferably in a range of between a temperature of 10° C. higher than Tg and a temperature of 50° C. higher than cold crystallization temperature (Tcc), and the draw rate to not higher than 10000%/min. The stretched multilayer film is preferred to be subjected to heat treatment (annealing), since sufficient dimensional stability can be obtained by such treatment. The temperature in heat treatment depends on the melting point or glass transition temperature of the film used, but usually it may be set to 120° to 270° C., and the treatment period may be approximately 5 seconds to 20 minutes.

Further, resin laminate (III) comprising a biaxially stretched SPS layer and a thermoplastic resin layer can be obtained by using the abovedescribed film of SPS biaxially stretched in advance in Method (2).

The laminate (IV) comprising a SPS layer and a metal layer is obtained by producing the film: of SPS by the usual process, and then providing metal layers by metallizing at least one side, that means one side or both sides of the said film. Herein metallization means providing metal layers on the surface of the substrate comprising the film of SPS by vacuum deposition. sputtering, plating, coating lamination and the like. In that process, laminate (V) can be produced by using the said film biaxially stretched as the film of SPS.

The thickness of the metal layer varies with the process for metallization. Specifically it is not more than 1 $\mu$m, preferably not more than 0.5 $\mu$m in vacuum deposition, sputtering and plating, 3 to 100 $\mu$m in lamination, and 0.01 to 10 $\mu$m in coating.

In the present specification, "deposition" means both of vacuum deposition and sputtering. Vacuum deposition is effected by evacuating the system to approximately $10^{-5}$ to $10^{-4}$ torr by use of vacuum pump, heating to melt the metal crucible for deposition in the system by use of an electron gun and the like, and depositing the evaporated metals onto the surface of the film. Sputtering is performed by evacuating the system to $10^{-4}$ to $10^{-2}$ torr, and depositing the metal generated from the target onto the film surface, by use of argon, for instance Before these depositions are carried out, it is preferred to make preevaporation to renew the surface of the metal target.

The word "laminating" means plating, coating and lamination.

Herein the kinds of the metals are as described before. The laminate having a metal layer of the present invention may be provided with metal layers directly on the surface of the stretched film of SPS as the substrate, or may have an intermediate layer such as layers for improving adhesivity or releasing between the film and metal layer according to the purposes. Particularly for the use of stamping foil, it is preferred to provide a releasing layer of silicone and the like as intermediate layer.

In the present invention, corona treatment, ozone treatment, plasma treatment or chemical etching can be performed before formation of metal layers, to increase the adhesivity of the substrate film.

Furthermore, the surface of the metal layer in the laminate of the present invention can be provided with a top coat layer, an adhesive layer, a tacky layer, a protection layer and the like.

The laminate comprising a SPS layer and a metal layer of the present invention can be effectively utilized for electrostatic capacitors, hot stamping foils, flexible printed circuit boards, food wrapping films, magnetic tapes or ornament films, and other functional films and materials.

Preferred resin laminates of present invention for electrostatic capacitors are those obtained by depositing 10 to 3000 Å of Al, Au, Cu, Cr and the like by use of deposition method or laminating these metals by use of aluminum foil, onto the film of 0.5 to 15$\mu$m in thickness formed by biaxially stretching a amorphous sheet of styrene-based polymer having a weight average molecular weight of 50,000 to 2,000,000, in a draw ratio of 2 to 20 in each direction.

Preferred resin laminates of the present invention for hot stamping foils are those obtained by biaxially stretching a amorphous sheet of a styrene based polymer having a weight average molecular weight of 100,000 to 1,500 000 in a draw ratio of 2 to 20 in each direction to have a film of 5 to 150$\mu$m in thickness, on which releasing layer, coloring layer, protective layer or the like is provided, and further, 100 to 3000 Å of Ag, Au, Al, Ti, Cu and other metals are deposited thereon by use of deposition process, and then onto the resulting laminate, a tacky layer is provided further.

Preferred resin laminates for flexible print substrate are those obtained by biaxially stretching a amorphous sheet of styrene-based polymer having a weight average molecular weight of 100,000 to 2,000,000 in a draw ratio of 2 to 20 in each direction to have a film of 12.5 to 150$\mu$m in thickness. (1)masking the said film and depositing electrically conductive metals such as Al thereon, (2)masking and etching after overall deposition, or (3)laminating metal foils such as copper foil, masking and etching and further laminating a comparatively thin styrene-based polymer film as cover lay.

Preferred resin laminates for food wrapping film or ornament films are those obtained by biaxially stretching a amorphous sheet of styrene-based polymer having a weight average molecular weight of 50,000 to 1,500,000 in a draw ratio of 2 to 20 to have a film of 10 to 50μm in thickness, depositing thereon 10 to 1000 Å of Al, Ag or the like by deposition process or laminating Al foil thereon, and then laminating a plastic film on the deposited or laminated Al surface at least.

Preferred resin laminates for magnetic tapes are those obtained by biaxially stretching the amorphous sheet of the styrene-based polymer having a weight average molecular weight of 150,000 to 1,500,000 at the draw ratio of 3 or more in the machine direction and 1.5 or more in the transverse direction to have a film of 3 to 100μm in thickness, on which a magnetic substance is coated by usual method or is deposited by deposition process as magnetic layer. Preferred metals for said magnetic layer are Fe, $Fe_2O_3$, Fe-Co, Fe-Ag, Fe-Mg, Fe-O, Co, Co-Ni, Co-Cr, Co-W, Co-Mo, Co-Ni-W, Co-Ni-P, Co-P, Co-O, Ni, Ni-Fe and the like.

The resin laminates comprising SPS layer and thermoplastic layer obtained by the above methods are provided with excellent gas barrier, mechanical properties and the like, while maintaining good heat-resistance, acid resistance, alkali resistance, hot water resistance, stiffness, electrical properties belonging to SPS.

Accordingly, the resin laminates of the present invention are expected to be utilized effectively and widely for usual wrapping film, sheet and electric or electronic materials, and further, food wrapping film required for heat resistance and hot water resistance. And the resin laminates containing metal layer obtained by above methods have higher gas barrier than not metaled stretched syndiotactic polystyrene film, and have high surfaceconductivity, steam resistance, high heat resistance. Furthermore, for the laminates containing metal layer, adhesion state between metal layer and SPS layer is good.

Consequently, said laminates are expected to be utilized for electrostatic capacitors, hot stamping foils, flexible print substrates, food wrapping films, and other functional films including magnetic tapes, and ornament films.

The present invention is described in greater detail with reference to the following examples.

PRODUCTION EXAMPLE (1) Preparation of Aluminum Compound as Catalyst Component

Two hundred milliliters of toluene was placed in a reactor, and 47.4 milliliters (492 millimoles) of trimethylaluminum and 35.5 grams (142 millimoles) of copper sulfate pentahydrate were added thereto and reacted at 20° C. for 24 hours.

Then the solid portion was removed from the reaction mixture to obtain a toluene solution containing 12.4 grams of aluminum compound as the catalyst component, that is, methylaluminoxane.

(2) Production of Styrene-Based Polymer

Two liters of toluene as a solvent, and 1 millimole of cyclopentadienyltitanium trichloride and 0.6 moles of methylaluminoxane obtained in (1) described above (as aluminum atom) as catalyst components were placed in a reactor, and then 3.6 liters of styrene was added at 20° C. and polymerized for 1 hour.

After the polymerization, the reaction product was washed with a mixture of hydrochloric acid and methanol to decompose and remove the catalyst components, and then dried to obtain 330 grams of a styrene-based polymer.

The polymer was subjected to Soxhlet extraction using methyl ethyl ketone as a solvent to obtain 95% by weight of an extraction residue. The weight average molecular weight of the polymer was 290,000, the number average molecular weight was 158,000, and the melting point was 270° C. A nuclear magnetic resonance spectral analysis of said polymer using carbon isotope ($^{13}$C-NMR) showed a signal at 145.35 ppm, ascribable to the syndiotactic configuration, and the syndiotacticity in terms of pentad as calculated from the peak area was 96%.

(3) Production of Styrene-Based Polymer

Two liters of toluene as a solvent, and 5 millimoles of tetraethoxytitanium and 500 millimoles of methylaluminoxane as aluminum atom obtained in above described (1) as catalyst components were placed in a reactor, and 15 liters of styrene was added at 55° C. and polymerized for 4 hours.

After polymerization, the reaction product was washed with a mixture of hydrochloric acid and methanol to decompose and remove the catalyst components, and then dried to obtain 2.5 kg of a styrene-based polymer (polystyrene). The polymer was subjected to Soxhlet extraction using methyl ethyl ketone as a solvent to obtain 97% by weight of the extraction residue. The weight average molecular weight of the residue was 400,000. A $^{13}$C-NMR analysis of the polymer showed a peak at 145.35 ppm, ascribable to the syndiotactic configuration, and the syndiotacticity in terms of racemic pentad as calculated from the peak area was 98%.

(4) Production of Styrene Based Polymer

Fifty milliliters of toluene and 0.075 millimoles of tetraethoxytitanate and 7.5 millimoles of methylaluminoxane obtained in abovedescribed (1) as aluminum atom were placed in a 1-liter reactor, and then 225 milliliters of styrene was added at 40° C. and subsequently hydrogen was introduced therein until the hydrogen pressure reached 5 kilograms/$cm^2$. Polymerization was performed for 1.5 hours.

After the polymerization, the reaction product was washed with a mixture of hydrochloric acid and methanol to decompose and remove the catalyst components, and then dried to obtain 150 grams of a polymer (polystyrene).

The weight average molecular weight of the polymer was 16,000, and the number average molecular weight thereof was 3,000. A $^{13}$C-NMR analysis showed a peak at 145.35 ppm, ascribable to the syndiotactic configuration, and the syndiotacticity in terms of pentad as calculated from the peak area was 98%.

EXAMPLE 1

A syndiotactic polystyrene (SPS) obtained in Production Example (3) and a polyethylene telephthalate (Intrinsic viscosity ($\eta$)=0.78 dl/g, Trade Name: Dianite MA 523, produced by Mitsubishi Rayon Co., Ltd.)

(PET) were coextruded by use of a cast molder provided with a multilayer die, under conditions of T die temperature of 300° C. and taking up rate of 1 m/second, and quenched by cooling roll to form a transparent film.

The combination of film layers is as SPS/PET/SPS (Thickness: 50μm/400μm/50μm). Said film was biaxially stretched at a draw ratio of 3×3 at 115° C. by use of table tenter. The physical properties of the stretched film are shown in Tabel 1.

EXAMPLE 2

The transparent film of PET/SPS/PET (Thickness: 50μm/400μm/50μm) was formed in the same manner as in Example 1, and biaxially stretched at a draw ratio of 3×3 by use of a table tenter. The stretched film obtained (Thickness: 6 μm/45 μm/6 μm) was transparent. The physical properties of the stretched film are shown in Table 1.

COMPARATIVE EXAMPLE 1

An atactic polystyrene (weight average molecular weight: 30×10⁴, Trade Name: Idemitsu Polystyrene HH30, produced by Idemitsu Petrochemical Co., Ltd.) (aPS) and PET were coextruded from a multilayer die under the same conditions as in Example 1 to form a transparent film of aPS/PET/aPS. Said film was biaxially stretched at a draw ratio of 3×3 by a trable tenter.

The stretched film obtained was transparent. The physical properties of the stretched film are shown in Table 1.

EXAMPLE 3

The same procedure was repeated as in Example 1 to form a cast film having two layers of SPS/PET (Thickness: 250μm/250μm). Said film was biaxially stretched to 3×3 times the original film by a table tenter.

The resulting stretched film (Thickness: 28μm/28μm) was transparent. The physical properties of the stretched film are shown in Table 1.

COMPARATIVE EXAMPLE 2

A cast film of aPS/PET was formed under the same conditions as in Example 3, and the film was biaxially stretched to 3×3 times the original film.

The resulting film was transparent. The physical properties of the stretched film are shown in Table 1.

COMPARATIVE EXAMPLE 3

SPS alone was cast molded to form a transparent sheet (Thickness: 500 μm), which was biaxially stretched to 3×3 times the original by a tale tenter in the same manner as in Example 1.

The resulting stretched film was transparent. The physical properties of the film are shown in Table 1.

COMPARATIVE EXAMPLE 4 aPS alone was cast molded to form a transparent sheet (Thickness: 500 μm), which was biaxially stretched to 3×3 times the original by a table tenter in the same manner as in Example 1.

The result of evaluation on the stretched film obtained are shown in Table 1.

COMPARATIVE EXAMPLE 5

PET alone was cast molded to form a transparent sheet (Thickness: 500μm), which was biaxially stretched to 3×3 times the original by a table tenter in the same manner as in Example 1.

The result of evaluation on the stretched film obtained are shown in Table 1.

EXAMPLE 4

The procedure of Example 1 was repeated except that polyphenylene sulfide (Intrinsic viscosity (η)=0.28 dl/g) (PPS) was used instead of PET, and that T die temperature was 320° C., to form a cast film of SPS/PPS/SPS. Then the cast film was biaxially stretched to 3×3 times the original (Temperature: 96° C.) to form stretched film. Both the cast film and the stretched film were transparent.

The result of evaluation on the stretched film obtained are shown in Table 1.

COMPARATIVE EXAMPLE 6

A film of aPS/PPS/aPS was formed using aPS instead of SPS, and biaxially stretched to 3×3 times the original (Temperature: 96° C.) to obtain a stretched film.

The result of evaluation on the stretched film are shown in Table 1.

EXAMPLE 5

The procedure of Example 4 was repeated except that the combination of the layers was PPS/SPS/PPS, to obtain a stretched film.

The result of the evaluation on the stretched film obtained are shown in Table 1.

EXAMPLE 6

The procedure of Example 4 was repeated except that a two-layer film of SPS/PPS was formed, to obtain a stretched film.

The result of the evaluation on the stretched film obtained are shown in Table 1.

EXAMPLE 7

A SPS film biaxially stretched and a film of Bisphenol A type polycarbonate (Viscosity average molecular weight: 3×10⁴, Trade Name: Idemitsu Polycarbonate A3000, produced by Idemitsu Petrochemical Co., Ltd.) (PC) were laminated through the medium of cured type urethane adhesive to form a three-layer film of SPS/PC/SPS (Thickness: 10 μm/50 μm/10 μm).

The result of evaluation on the resulting film are shown in Table 1.

COMPARATIVE EXAMPLE 7

A laminate film of aPS/PC/aPS was formed under the same conditions as in Example 7 except that aPS film biaxialy stretched was used.

The result of evaluation on the resulting film are shown in Table 1.

COMPARATIVE EXAMPLE 8

The physical properties of PC film (Thickness: 500μm) only used in Example 7. The result is shown in Table 1.

EXAMPLE 8

By use of nylon (Number average molecular weight: 24,000, Trade Name: Union, produced by Idemitsu Petrochemical Co., Ltd.) (Ny) as the film to be laminated, the same procedure as in Example 7 was repeated to form a three-layer film of SPS/Ny/SPS (Thickness: 10 μm/50 μm/10μm).

The result of the evaluation on the film obtained are shown in Table 1.

EXAMPLE 9

By use of PET, Ny and SPS, the same procedure as in Example 7 was repeated to form a three-layer laminate film of PET/Ny/SPS.

The result of the evaluation on the film obtained are shown in Table 1.

COMPARATIVE EXAMPLE 10 aPS film was used instead of SPS film, to form a two-layer laminate film of aPS/Ny (Thickness: 25 μm/25 μm).

The result of the evaluation on the film obtained are shown in Table 1.

COMPARATIVE EXAMPLE 11

The physical properties of Ny film (Thickness: 25 μm) only were evaluated. The result is shown in Table 1.

TABLE 1

| No. | Combination of Layers | Process for Production | Tensile*[1] Strength (kg/mm$^2$) | Oxygen*[2] permeability (cc/m$^2$ · 24 hr · atm) | Steam*[3] resistance | Acid*[4] resistance | Alkali*[5] resistance | Organic*[6] solvent resistance |
|---|---|---|---|---|---|---|---|---|
| Example 1 | SPS/PET/SPS | Cast | 15 | 18 | ◉ | ◎ | ◉ | ◎ |
| Example 2 | PET/SPS/PET | Cast | 17 | 12 | ○ | ○ | ○ | ◎ |
| Example 3 | SPS/PET | Cast | 12 | 30 | ○ | ○ | ○ | ◎ |
| Comparative Example 1 | aPS/PET/aPS | Cast | 11 | 35 | × | ◎ | ◎ | × |
| Comparative Example 2 | aPS/PET | Cast | 11 | 25 | × | ○ | ○ | × |
| Comparative Example 3 | SPS | Cast | 8 | 250 | ◎ | ◎ | ◉ | ◎ |
| Comparative Example 4 | aPS | Cast | 7 | 300 | × | ◎ | ◎ | × |
| Comparative Example 5 | PET | Cast | 22 | 3 | × | ○ | ○ | ◎ |
| Example 4 | SPS/PPS/SPS | Cast | 12 | 80 | ◎ | ◎ | ◎ | ◎ |
| Comparative Example 6 | aPS/PPS/aPS | Cast | 10 | 230 | × | ◎ | ◎ | × |
| Example 5 | PPS/SPS/PPS | Cast | 16 | 50 | ◎ | ◎ | ◎ | ◎ |
| Example 6 | SPS/PPS | Cast | 15 | 80 | ◎ | ◎ | ◎ | ◉ |
| Example 7 | SPS/PC/SPS | Lamination | 9 | 260 | ◎ | ◎ | ◎ | ◉ |
| Comparative Example 7 | aPS/PC/aPS | Lamination | 10 | 290 | × | ○ | × | × |
| Comparative Example 8 | PC | — | 10 | 300 | × | ○ | × | × |
| Example 8 | SPS/Ny/SPS | Lamination | 15 | 10 | ◎ | ◎ | ◎ | ◎ |
| Example 9 | SPS/Ny/PET | Lamination | 18 | 5 | ○ | ○ | ○ | ◎ |
| Example 10 | SPS/Ny | Lamination | 15 | 15 | ○ | ○ | ○ | ◎ |
| Comparative Example 9 | aPS/Ny/aPS | Lamination | 12 | 15 | × | ○ | ○ | × |
| Comparative Example 10 | aPS/Ny | Lamination | 12 | 20 | × | ○ | ○ | × |
| Comparative Example 11 | Ny | — | 22 | 2 | × | ○ | ○ | ◎ |
| Example 11 | SPS/PVDC/SPS | Lamination | 13 | less than 1 | ◉ | ◎ | ◎ | ◎ |

*[1] In accordance with JIS Z 1702
*[2] In accordance with JIS Z 1707 at 23° C.
*[3] Left for 100 hours at 120° C. in steam
*[4] In accordance with JIS K 7114
*[5] In accordance with JIS K 7114
*[6] In accordance with JIS K 7114

Marks or symbols in the table express the following change in films after the test.
◎ ... No or little change
○ ... Slightly deteriorated, but no problem for practical use
× ... Too deteriorated to use

EXAMPLE 10

The same procedure as in Example 7 was repeated to form a two-layer laminate film of SPS/Ny (Thickness: 25 μm/25 μm).

The result of the evaluation on the film obtained are shown in Table 1.

EXAMPLE 11

Two of biaxially stretched SPS films and a film of polyvinylidene chloride (Trade Name: Saran Wrap, produced by Asahi kasei Co., Ltd.)(PVDC) are laminated by use of hardening-type urethane-based adhesives to form a laminated film having three layers of SPS/PVDC/SPS (Thickness: 10 μm/12 μm/10 μm).

The physical properties of the laminated film are shown in Table 1.

EXAMPLE 12

A hundred parts by weight of polystyrene powder having syndiotactic configuration obtained in Production Example (2) described above and 0.7 parts by weight of bis(2,4-di-tert-butylphenyl)pentaerythritol diphosphite and 0.1 parts by weight of 2,6-di-tert-butyl-4-methylphenol as antioxidants were dry-blended. Then the powder resulted was melted at 296° to 300° C., and quenched to form a amorphous compressed sheet.

Said sheet was then heated to 120° C. and subjected to simultaneous biaxial stretching at a draw ratio of 3.5×3.5 in each direction. The biaxially stretched film was subjected to heat treatment for 30 seconds in a stage of tention and in air-oven of 250° C. The film thus obtained was 12 μm in thickness and has excellent transparency.

On the said film, aluminum was deposited by use of a vacuum deposition apparatus of Bell-Jar type.

As the result of a deposition where intensity of electronic beam was 2.6 kW, vacuum degree was $5 \times 10^{-5}$ torr, deposition rate is 3 Å/sec., a laminate film having aluminum layer of 0.1 μm was obtained.

Said film with deposition has a gas transmission coefficient of 0.002 cc.cm/cm$^3$.sec.cmHg and a ray transmittance of 0. A comparison after the film was left for 100 hours in steam of 120° C. shows no change in appearance from the states before the treatment, and the change in tensile properties was within 1%.

The surface of the said aluminum layer was cut with a cutter into a grid pattern of 1 mm square, on which a cellophane adhesive tape was pressed, pulled with an angle of 90° C., but the aluminum layer deposited was not peeled off at all.

The dielectric loss tangent (tan δ) of the film with deposition was measured at 150° C. at 1 kHz, to be found as small as 0.002. Furthermore, the said film was cut to exactly 10 cm square, and dipped in a silicone oil bath of 200° C. After 5 minutes' dip, the dimentional change was measured, and a shrinkage of an small as 0.5% was found.

EXAMPLE 13

The procedure of Example 12 was repeated except that the thickness of the amorphous compressed sheet was controlled to obtain a stretched film having a thickness of 25 μm, which was subjected to deposition. The result is shown in Table 2.

EXAMPLE 14

The same procedure as in Example 13 was repeated except that the thickness of the deposited layer was 0.05 μm. The result is shown in Table 2.

EXAMPLE 15

The same procedure as in Example 13 was repeated except that the deposition was carried out by sputtering. The result is shown in Table 2.

Before performing the sputtering, pre-sputtering was effected to renew the surface of the target, and then sputtering was carried out in vacuum of $5 \times 10^{-3}$ torr with a load of 370V and 2A. The result is shown in Table 2.

EXAMPLE 17

The same procedure as in Example 12 was repeated except that the amorphous compressed sheet was controlled for its thickness to obtain a stretched film of 50 μm in thickness, which was subjected to deposition. The result is shown in Table 2.

EXAMPLE 18

An aluminum foil of 15 μm in thickness was laminated on the stretched film of 50 μm obtained in Example 17, with an epoxy resin adhesive The result is shown in Table 2.

EXAMPLE 19

The same procedure as in Example 13 was repeated except that 95 parts by weight of the syndiotactic styrene-based polymer obtained in Production Example (2) and 5 parts by weight of poly(2,6-dimethyl-1,4-phenylene)ether (produced by GEM Polymer Co.,Ltd., Intrinsic viscosity in chloroform of 30° C.: 0.49 dl/g) were used. The result is shown in Table 2.

EXAMPLE 20

The same procedure as in Example 13 was repeated except that 95 parts by weight of the syndiotactic styrene-based polymer obtained in Production Example (2) and 5 parts by weight of atactic polystyrene (HH-30F, produced by Idemitysu Petrochemical Co., Ltd.) were used. The result is shown in Table 2.

COMPARATIVE EXAMPLE 12

The physical properties of the stretched film without being deposited in Example 13 are shown in Table 2.

COMPARATIVE EXAMPLE 13

A amorphous sheet was formed in the same manner as in Example 12, by use of the syndiotactic styrene-based polymer obtained in Production Example (4). The sheet thus obtained was too weak to be subjected to stretching.

COMPARATIVE EXAMPLE 14

A amorphous sheet having a thickness of 60 μm was obtained in the same manner as in Example 12, using the syndiotactic styrene-based polymer obtained in Production Example (2). After the said film was heat-treated at 260° C. for 30 seconds in the state of tention, a white film was obtained. Said film was subjected to deposition in the same manner as in Example 12. The result is shown in Table 2.

COMPARATIVE EXAMPLE 15

The same procedure as in Example 12 was repeated except that a polyester film (Thickness: 12 μm, Trade Name: E5000, produced by Toyobo Co., Ltd. ) was used. The result is shown in Table 2.

COMPARATIVE EXAMPLE 16

The same procedure as in Example 12 was repeated except that polyphenylene sulfide film (Thickness: 12 μm, Trade Name: TORELINA, produced by Toray Co., Ltd. ) was used. The result is shown in Table 2.

COMPARATIVE EXAMPLE 17

By the use of a nylon film (Thickness: 12 μm, Trade Name: Emblem ON, produced by Yunichika Co., Ltd. ), a deposition treatment was effected in the same manner as in Example 12, on the surface of the film which has not been subjected to corona treatment. The result is shown in Table 2.

TABLE 2

| No. | Resins[1] | Weight[2] Average Molecular Weight | Draw Ratio | Thickness of Film (μm) | Method of Lamination | Thickness of Metal Layer (μm) | Gas[3] Permeability (cc · cm/cm$^2$ · sec. cmHg) |
| --- | --- | --- | --- | --- | --- | --- | --- |
| Example 12 | SPS | 290,000 | 3.5 × 3.5 | 12 | Vacuum Deposition | 0.1 | 0.002 |
| Example 13 | SPS | 290,000 | 3.5 × 3.5 | 25 | Vacuum Deposition | 0.1 | 0.002 |
| Example 14 | SPS | 290,000 | 3.5 × 3.5 | 25 | Vacuum Deposition | 0.05 | 0.003 |

TABLE 2-continued

| | | | | | | | |
|---|---|---|---|---|---|---|---|
| Example 15 | SPS | 290,000 | 3.5 × 3.5 | 25 | Sputtering | 0.1 | 0.002 |
| Example 16 | SPS | 400,000 | 3.5 × 3.5 | 25 | Vacuum Deposition | 0.1 | 0.002 |
| Example 17 | SPS | 290,000 | 3.5 × 3.5 | 50 | Vacuum Deposition | 0.1 | 0.002 |
| Example 18 | SPS | 290,000 | 3.5 × 3.5 | 50 | Lamination | 15 | 0.0001< |
| Example 19 | SPS/PPQ | 290,000 | 3.5 × 3.5 | 25 | Vacuum Deposition | 0.1 | 0.002 |
| Example 20 | SPS/aPS | 290,000 | 3.5 × 3.5 | 25 | Vacuum Deposition | 0.1 | 0.002 |
| Comparative Example 12 | SPS | 290,000 | 3.5 × 3.5 | 25 | No | — | 3.9 |
| Comparative Example 13 | SPS | 16,000 | Unstretchable | — | — | — | — |
| Comparative Example 14 | SPS | 290,000 | 1.0 × 1.0 | 60 | Vacuum Deposition | 0.1 | 3.7 |
| Comparative Example 15 | PET | — | — | 12 | Vacuum Deposition | 0.1 | 0.0002 |
| Comparative Example 16 | PPS | — | — | 12 | Vacuum Deposition | 0.1 | 0.0005 |
| Comparative Example 17 | Ny | — | — | 12 | Vacuum Deposition | 0.1 | 0.0001 |

| No. | Steam[4] Resistance (120° C., 100 hr) | Peeling[5] Test | Tensile Modulus (kg/cm$^2$) | tan δ[6] (150° C., 1 kHz) | Thermal[7] Shrinkage (200° C., %) |
|---|---|---|---|---|---|
| Example 12 | | | 51,000 | 0.002 | 0.5 |
| Example 13 | | | 49,000 | 0.002 | 0.5 |
| Example 14 | | | 49,000 | 0.002 | 0.5 |
| Example 15 | | | 49,000 | 0.002 | 0.5 |
| Example 16 | | | 55,000 | 0.002 | 0.5 |
| Example 17 | | | 47,000 | 0.002 | 0.5 |
| Example 18 | | — | — | — | — |
| Example 19 | | | 52,000 | 0.002 | 1.0 |
| Example 20 | | | 46,000 | 0.003 | 1.0 |
| Comparative Example 12 | — | — | 48,000 | 0.002 | 0.5 |
| Comparative Example 13 | — | — | — | — | — |
| Comparative Example 14 | | | 30,000 | 0.002 | — |
| Comparative Example 15 | × | | 40,000 | 0.004 | 0.5 |
| Comparative Example 16 | | × | 40,000 | 0.005 | 1.5 |
| Comparative Example 17 | × | | 22,000 | — | 2.5> |

[1]SPS: Syndiotactic polystyrene PPO: Polyphenylene oxide aPS: Atactic polystyrene PET: Polyethylene telephthalate PPS: Polyphenylene sulfide Ny: Nylon PVDC: Polyvinylidene chloride
[2]Weight average molecular weight of SPS was measured by Gel Permeation Chromatography (GPC) using 1,2,4-trichlorobenzene as solvent
[3]In accordance with ASTM D-1434-75M
[4] :No change in appearance or strength ×: Fall in strength, changes in appearance
[5]Number of the exfoliated ones in 100 squares of 1 mm × 1 mm : None ×: 30 or more
[6]measured with laminating metals on both surfaces
[7]Shrinkage of a square film of 10 cm × 10 cm after 5 minutes' dip in silicone oil bath of 200° C. (in the machine direction)

What is claimed is:

1. A metallized laminate comprising
a layer of styrene-based polymer having mainly syndiotactic configuration, said layer having two surfaces; and
a metal layer, said metal layer being disposed on a first of said surfaces.

2. The metallized laminate of claim 1, wherein the metal layer comprises aluminum.

3. The metallized laminate of claim 1, further comprising a metal layer disposed on a second of said surfaces.

4. A process for producing the metallized laminate of claim 1, which comprises providing the metal layer by deposition of lamination on the first surface of the layer of styrene-based polymer having mainly syndiotactic configuration.

5. A metallized laminate comprising
a biaxially stretched layer of styrene-based polymer having mainly syndiotactic configuration, said layer having two surfaces; and
a metal layer, said metal layer being disposed on a first of said surfaces.

6. The metallized laminate claimed in claim 1 or 5, wherein the metal layer is made of at least one member selected from the group consisting of aluminum, chromium, nickel, zinc, cobalt, iron, tin, indium, an alloy thereof and an oxide thereof.

7. The metallized laminate of claim 5 further comprising a metal layer disposed on a second of said surfaces.

8. A process for producing the metallized laminate of claim 5, which comprises providing the metal layer by deposition of lamination on one of or both surfaces of the film obtained by biaxially stretching a styrene-based polymer having mainly syndiotactic configuration at a temperature not lower than its glass transition temperature and not higher than its melting point.

* * * * *